United States Patent
Ito et al.

(10) Patent No.: US 9,633,879 B2
(45) Date of Patent: Apr. 25, 2017

(54) STORAGE SYSTEM IN THE CEILING SPACE AND STORAGE METHOD FOR GOODS THEREBY

(71) Applicant: MURATA MACHINERY, LTD., Kyoto-shi, Kyoto (JP)

(72) Inventors: Yasuhisa Ito, Ise (JP); Masahiro Ikeda, North Salt Lake, UT (US); Yuichi Imamura, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 209 days.

(21) Appl. No.: 14/277,125

(22) Filed: May 14, 2014

(65) Prior Publication Data
US 2015/0329298 A1    Nov. 19, 2015

(51) Int. Cl.
*H01L 21/677* (2006.01)
*B65G 1/04* (2006.01)

(52) U.S. Cl.
CPC ...... *H01L 21/67733* (2013.01); *B65G 1/0464* (2013.01); *H01L 21/67769* (2013.01); *B65G 2201/0297* (2013.01)

(58) Field of Classification Search
CPC .... B61B 3/00; B61B 3/02; B61B 5/00; B61B 5/02; B61B 10/00; B61B 10/022; H01L 21/67706; H01L 21/67727; H01L 21/6773; H01L 21/67733; H01L 21/67769; H01L 21/67775; Y10S 414/14
USPC ..... 198/347.1, 347.2, 347.3, 347.4; 414/277, 414/278, 281, 285, 331.03, 331.04, 414/331.12, 331.14, 331.15, 331.18, 940
See application file for complete search history.

(56) References Cited

U.S. PATENT DOCUMENTS

| | | | |
|---|---|---|---|
| 8,851,819 B2* | 10/2014 | Kamikawa | H01L 21/67727 414/222.07 |
| 2003/0229416 A1 | 12/2003 | Tai et al. | |
| 2004/0109746 A1* | 6/2004 | Suzuki | H01L 21/67727 414/373 |

(Continued)

FOREIGN PATENT DOCUMENTS

| | | |
|---|---|---|
| JP | 10-45213 A | 2/1998 |
| JP | 2004-010250 A | 1/2004 |

(Continued)

OTHER PUBLICATIONS

English translation of Official Communication issued in corresponding International Application PCT/JP2015/061321, mailed on Nov. 17, 2016.

*Primary Examiner* — Michael McCullough
*Assistant Examiner* — Brendan Tighe
(74) *Attorney, Agent, or Firm* — Keating & Bennett, LLP

(57) ABSTRACT

A storage system in a ceiling space includes overhead traveling vehicles and a traveling route for the same, a shuttle carriage configured to transport goods to and from processing devices and a traveling route for the same, an OHT port to and from which the overhead traveling vehicles and the shuttle carriage both transport goods, and buffers that are provided in the ceiling space above the processing device and are for the placement of goods by the shuttle carriage. The traveling route for the shuttle carriage enables delivery and reception of goods by the shuttle carriage between the load port of the processing devices, the buffers, and the OHT port.

9 Claims, 4 Drawing Sheets

(56) References Cited

U.S. PATENT DOCUMENTS

| | | |
|---|---|---|
| 2006/0182553 A1 | 8/2006 | Yamamoto et al. |
| 2006/0237525 A1* | 10/2006 | Sone ................ H01L 21/67294 |
| | | 235/375 |
| 2007/0224026 A1 | 9/2007 | Chang |
| 2012/0114453 A1 | 5/2012 | Ota et al. |
| 2013/0061772 A1 | 3/2013 | Chen et al. |
| 2015/0110585 A1* | 4/2015 | Ota ................... H01L 21/67733 |
| | | 414/222.13 |
| 2016/0071754 A1* | 3/2016 | Ota ..................... B65G 1/0457 |
| | | 414/222.02 |

FOREIGN PATENT DOCUMENTS

| | | | | |
|---|---|---|---|---|
| JP | 2006298566 A | * | 11/2006 | ....... H01L 21/67294 |
| JP | 2012-114406 A | | 6/2012 | |
| JP | 2012253070 A | * | 12/2012 | ....... H01L 21/67727 |

* cited by examiner

STORAGE SYSTEM IN THE CEILING SPACE AND STORAGE METHOD FOR GOODS THEREBY

BACKGROUND OF THE INVENTION

1. Field of the Invention

The present invention relates to the storage of goods above a processing device using an overhead traveling vehicle, a shuttle carriage, and a buffer.

2. Description of the Related Art

A system for using an overhead traveling vehicle to transport a large number of goods to and from a processing device is used in clean rooms and the like. JP4296601 proposes a system in which a local carriage is arranged above a load port in the front surface of a processing device, and a buffer is arranged between the track for the local carriage and the track for an overhead traveling vehicle. With this system, the overhead traveling vehicle is used exclusively for transport to the buffer, and transport between the buffer and the load port of the processing device is performed by the local carriage.

JP2012-114406 discloses a system in which a track for an overhead traveling vehicle and a track for a local carriage are arranged one above the other above a load port, and a buffer used in common by the overhead traveling vehicle and the local carriage is provided above the load port. With this system, both the overhead traveling vehicle and the local carriage can transport goods to and from the load port, and use the buffer in common.

In both of the systems in JP4296601 and JP2012-114406, the buffer is arranged in the ceiling space above the passageway in front of the processing device. There is a limit on the number of buffers that can be installed since the buffer installation space is limited to the space in the passageway. Furthermore, although the ceiling space is used, arranging the buffers in the passageway limits the use of the passageway.

SUMMARY OF THE INVENTION

Preferred embodiments of the present invention provide buffers that do not obstruct a passageway and have a high storage capacity in a system that uses overhead traveling vehicles.

A storage system in a ceiling space according to a preferred embodiment of the present invention is a system for using overhead traveling vehicles to transport goods to processing devices that have a load port, the system including a traveling route for the overhead traveling vehicles; a shuttle carriage configured to transport goods to and from the processing devices; a traveling route for the shuttle carriage; an OHT port configured to enable the overhead traveling vehicles and the shuttle carriage to both transport goods to and from the OHT port; and buffers that are provided in a ceiling space above the processing devices and are configured to enable placement of goods by the shuttle carriage, wherein the traveling route for the shuttle carriage is configured so as to enable delivery and reception of goods by the shuttle carriage between the load port of the processing devices, the buffers, and the OHT port.

A storage method for goods in a ceiling space according to another preferred embodiment of the present invention is a method in which a storage system in a ceiling space includes a traveling route for overhead traveling vehicles, a shuttle carriage configured to transport goods to and from the processing devices, a traveling route for the shuttle carriage, an OHT port configured to enable the overhead traveling vehicles and the shuttle carriage to both transport goods to and from the OHT port, and buffers that are provided in a ceiling space above the processing devices and are configured to enable placement of goods by the shuttle carriage, wherein the traveling route for the shuttle carriage is configured so as to enable delivery and reception of goods by the shuttle carriage between the load port of the processing devices, the buffers, and the OHT port, the method including using the storage system in a ceiling space to transport goods to and from the OHT port using the overhead traveling vehicles, transport goods between the OHT port, the buffers, and the load port using the shuttle carriage, and store goods in the buffers using the shuttle carriage.

According to various preferred embodiments of the present invention, buffers are provided in the ceiling space above a processing device, thus making it possible to provide buffers that do not utilize the space in a passageway. Since this buffers utilize the large amount of space above the processing device, a large number of goods is capable of being stored. Descriptions regarding the storage system in a ceiling space directly apply to the storage method for goods in a ceiling space as well. Also, "tool" indicates a processing device, and "track", "traveling route", and "route" all have the same meaning.

It is preferable that the traveling route for the overhead traveling vehicles is provided so as to pass through the ceiling space above the processing device, the OHT port is provided in the ceiling space above the processing device, the traveling route for the shuttle carriage is a U-shaped or substantially U-shaped traveling route that extends from a region above the load port to the ceiling space above the processing device via a connection portion, and at least two rows of buffers are provided in the U-shaped or substantially U-shaped traveling route.

According to the above configuration, the traveling route for the overhead traveling vehicles, the OHT port, the buffers, and half of the traveling route for the shuttle carriage are configured to utilize the ceiling space above the processing device. The traveling route for the shuttle carriage preferably is U-shaped or substantially U-shaped, and it is possible to provide at least two rows of buffers, for example.

It is preferable that the load port is provided on a passageway side of a front surface of the processing devices, two types of OHT ports are provided as the OHT port, namely an OHT port on the passageway side relative to the load port and an OHT port on the processing device side that is provided in the ceiling space above the processing devices, a traveling route above the passageway configured to transport goods to and from the OHT port on the passageway side and a traveling route above the processing device configured to transport goods to and from the OHT port on the processing device side are provided as the traveling route for the overhead traveling vehicles, and a traveling route configured to transport goods to and from the load port and the OHT port on the passageway side, a traveling route configured to transport goods to and from the buffers and the OHT port on the processing device side, and a connection portion configured to connect the traveling routes are provided as the traveling route for the shuttle carriage.

According to the above configuration, the overhead traveling vehicles transport goods to and from the processing devices with both the traveling route above the passageway and the traveling route above the processing device. Note that the traveling route for the shuttle carriage turns back via a connection portion so as to be U-shaped or substantially U-shaped, for example. The buffer storage capacity preferably is increased by arranging two rows of buffers rather one row between the two arms of the U-shaped or substantially U-shaped route. For example, in FIG. 1, three rows of buffers can be arranged by adding buffers directly below the traveling route 14.

Also, it is preferable that the shuttle carriage and the overhead traveling vehicles have the same structure, and a connection portion that connects the traveling route for the overhead traveling vehicles and the traveling route for the shuttle carriage is provided. If the shuttle carriage and the overhead traveling vehicles are capable of traveling along the same traveling route, it is easy to arrange the shuttle carriage on that traveling route and perform maintenance on the shuttle carriage. Here, due to the shuttle carriage and the overhead traveling vehicles preferably having the same structure, that is to say, the same hardware structure, there is no need to prepare dedicated parts for maintenance of the shuttle carriage and the like. Also, if a problem occurs with the shuttle carriage, if the transport performance of the shuttle carriage is insufficient, or the like, the overhead traveling vehicles can be operated as a shuttle carriage, whereas if a shuttle carriage is not required, it can be operated as an overhead traveling vehicle.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The following describes preferred embodiments of the present invention.

Figure 1:
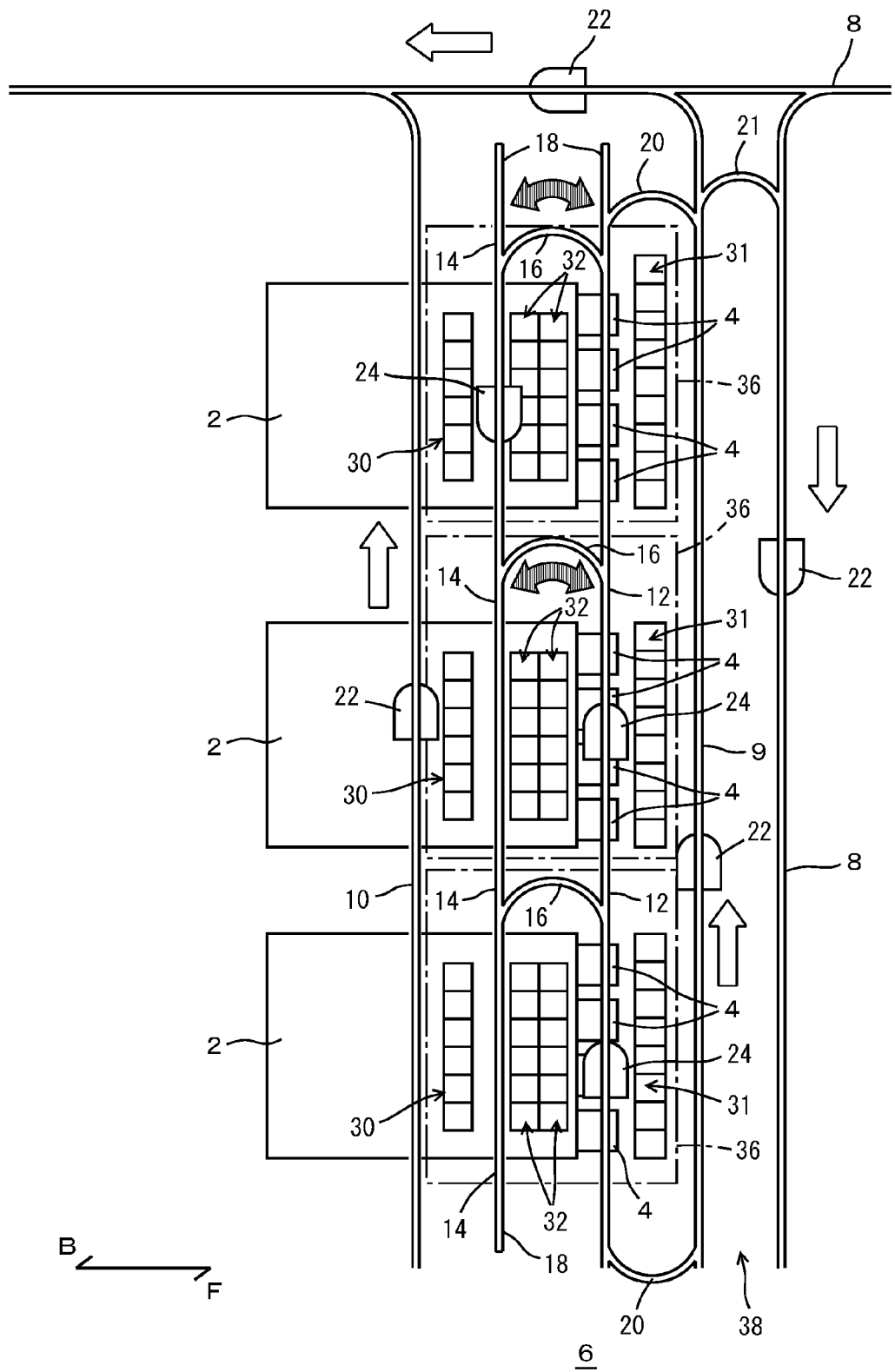
FIG. 1 is a plan view of a storage system in a ceiling space according to a preferred embodiment of the present invention.
Figure 2:
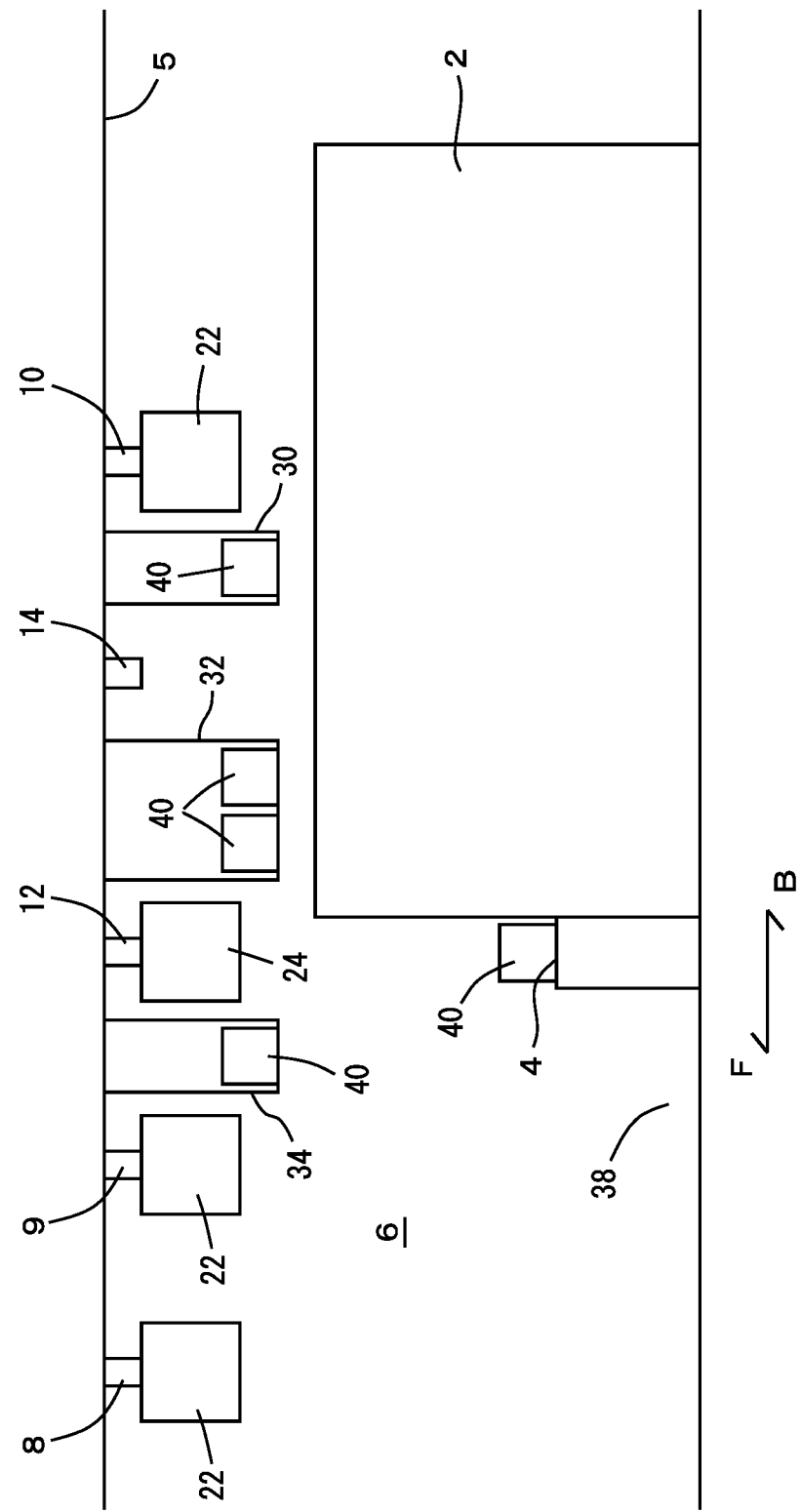
FIG. 2 is a front view of the storage system in a ceiling space according to a preferred embodiment of the present invention.

FIGS. 1 to 6 show a storage system in a ceiling space 6 according to a preferred embodiment of the present invention. In FIGS. 1 and 2, reference numeral 2 indicates processing devices (tool) such as semiconductor wafer processing devices, inspection devices, or the like. The processing devices 2 include one or more load ports 4 on a passageway 38 side of a front surface as entrances and exits for goods 40 such as containers housing semiconductor wafers. Note that in this description of a preferred embodiment of the present invention, the load port 4 side of the processing devices 2 is called the front or front surface, and the opposite side is called the rear or rear portion, as shown in FIGS. 1 and 2. Also, reference numeral 5 in FIG. 2 indicates the ceiling of a clean room or the like. The space that cannot be reached by the hands of a person walking along the passageway 38 is called the ceiling space, and the ceiling space above the processing device 2 is utilized in various preferred embodiments of the present invention in particular.

Reference numeral 6 indicates the storage system in a ceiling space, which is configured by overhead traveling vehicles (OHT) 22 and traveling routes 8 to 10 for the OHT, shuttle carriages (OSS) 24 and traveling routes 12 and 14 for the OSS, OHT ports 30 and 31, and buffers 32. The traveling routes 8 to 10, 12, and 14 are tracks provided in the ceiling space, and the tracks preferably have the same structure. Also, the overhead traveling vehicles 22 and the shuttle carriages 24 preferably have the same structure. That is to say, the structure is the overhead traveling vehicles 22 when it operates as part of the overhead traveling vehicle system that includes the traveling routes 8 to 10, whereas it is the shuttle carriages 24 when they operate as local carriages in an OSS area 36. The overhead traveling vehicles 22 and the shuttle carriages 24 preferably have the same physical structure and both travel along the traveling routes 8 to 10, 12, and 14, and also chuck, raise, and lower goods 40 using an elevation platform (not shown) as well as laterally move the elevation platform to the left and right. Note that the delivery and reception of goods may be performed without using raising and lowering.

The traveling routes 8 and 9 (the traveling route 8 in particular) for the overhead traveling vehicles 22 do not need to be provided. The traveling route 9 is arranged in the ceiling space of the passageway 38, parallel or substantially parallel to the front surface of the processing devices 2, and the traveling route 10 is arranged in the ceiling space above the rear portion of the processing devices 2. The traveling route 12 for the shuttle carriages 24 is arranged in the ceiling space above the load ports 4, parallel or substantially parallel to the front surface of the processing devices 2, and the traveling route 14 is arranged in the ceiling space above the rear portion of the processing device 2. The traveling routes 9, 10, 12, and 14 are parallel or substantially parallel to each other, and are at the same height level, for example. Furthermore, the overhead traveling vehicles 22 travel along the traveling routes 8, 9, and 10 in one direction as indicated by the hollow arrows in FIG. 1. The shuttle carriages 24 travel back and forth along the traveling routes 12 and 14 via a connection portion 16 in one OSS area 36 in principle, as shown by the hatched arrows. The traveling routes 12 and 14 and the connection portion 16 define a traveling route that preferably has an overall U-shaped or substantially U-shaped configuration. Note that "OSS" is an abbreviation for Overhead Staging Shuttle or Overhead Staging System, and "OHT" is an abbreviation for OverHead Traveler. The traveling routes 14 and 12 for the shuttle carriage 24 are connected to the traveling routes 9, 8, and 10 for the overhead traveling vehicle 22 via connection portions 20 and 21.

A large number of OHT ports 30 are preferably arranged in the ceiling space between the traveling routes 10 and 14 above the rear portions of the processing devices 2, and a large number of OHT ports 31 are preferably arranged in the ceiling space between the traveling routes 9 and 12 above the passageway 38. Also, two rows of buffers 32, for example, are arranged between the traveling routes 12 and 14. One OSS area 36 is provided for each processing device 2 or for multiple processing devices 2, for example, and one or more shuttle carriages 24 (one in the present preferred embodiment) are arranged in each OSS area 36. The traveling routes 12 and 14 are arranged so as to connect multiple OSS areas 36, and preferably have an overall linear or substantially linear configuration, for example. A withdrawal portion 18 is provided at at least one end of the traveling routes 12 and 14, and is used for the withdrawal of shuttle carriages 24 that require maintenance, shuttle carriages 24 and overhead traveling vehicles 22 that are unnecessary in terms of the transport load, and the like, and also used to charge the batteries of the shuttle carriage 24 and overhead traveling vehicle 22 as necessary when they are battery-driven.

Figure 3:
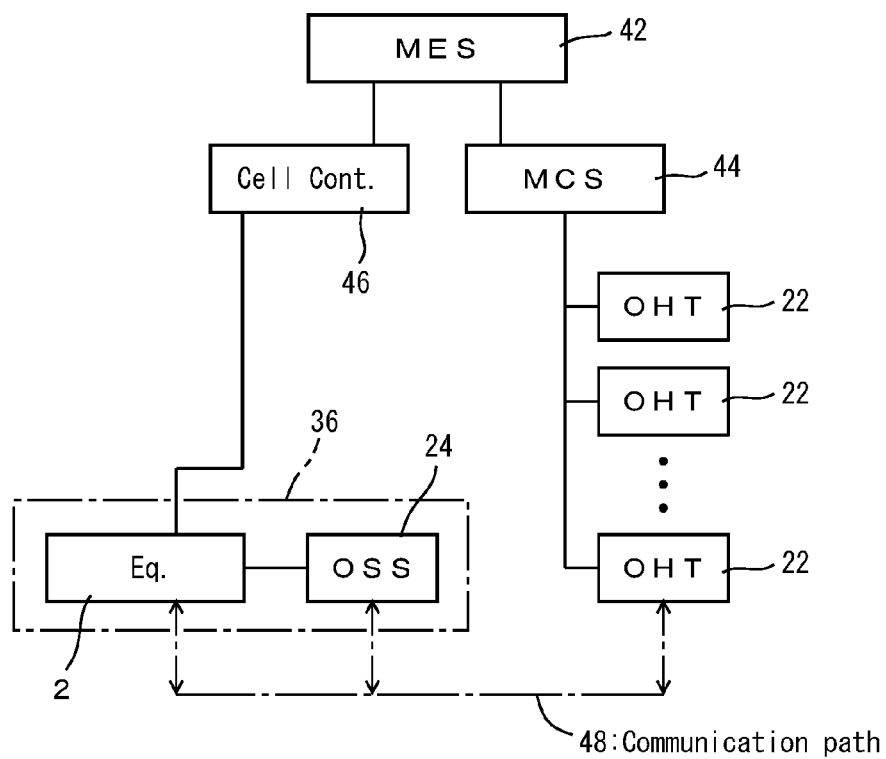
FIG. 3 is a block diagram showing a control system in the storage system in a ceiling space according to a preferred embodiment of the present invention.

FIG. 3 shows management of the overhead traveling vehicles 22 and the shuttle carriages 24. Reference numeral 42 indicates an MES (manufacturing execution system) that manages the production of semiconductors in the clean room, reference numeral 44 indicates an MCS (material control system) that manages the transport of goods to and from the processing device 2, and 46 indicates a cell controller that manages processing devices 2 individually or in units of multiple processing devices 2. In FIG. 3, the overhead traveling vehicles 22 are managed by the MCS 44, the shuttle carriages 24 are managed by the cell controller 46, and the processing device 2, the shuttle carriages 24, and the overhead traveling vehicles 22 communicate via an appropriate communication path 48.

Figure 4:
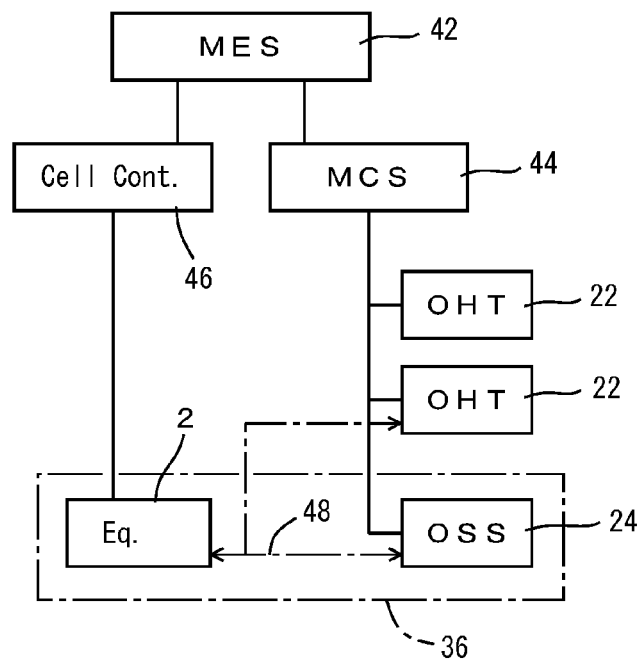
FIG. 4 is a block diagram showing a control system according to a variation of a preferred embodiment of the present invention.

In the example shown in FIG. 4, the shuttle carriages 24 are managed by the MCS 44, and similarly to FIG. 3, the processing device 2, the shuttle carriages 24, and the overhead traveling vehicles 22 communicate via the communication path 48.

Figure 5:
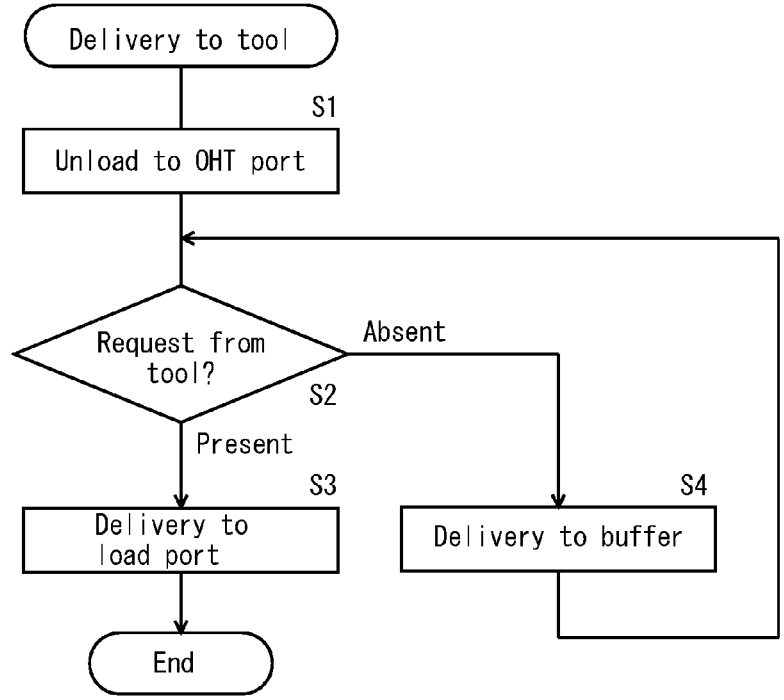
FIG. 5 is a flowchart showing an algorithm for delivery to a tool (processing device) according to a preferred embodiment of the present invention.

FIG. 5 shows an algorithm for the delivery of goods to processing devices. In step S1, an article is unloaded to an OHT port by an overhead traveling vehicle, and then if there has been a request from a processing device (tool) or the like (step S2), a shuttle carriage delivers the article from the OHT port to a load port (step S3). If there has not been a request from a processing device, the shuttle carriage delivers the article from the OHT port to a buffer (step S4), and then the article is delivered to the load port upon reception of a request from a processing device or the like (steps S2 and S3).

Figure 6:
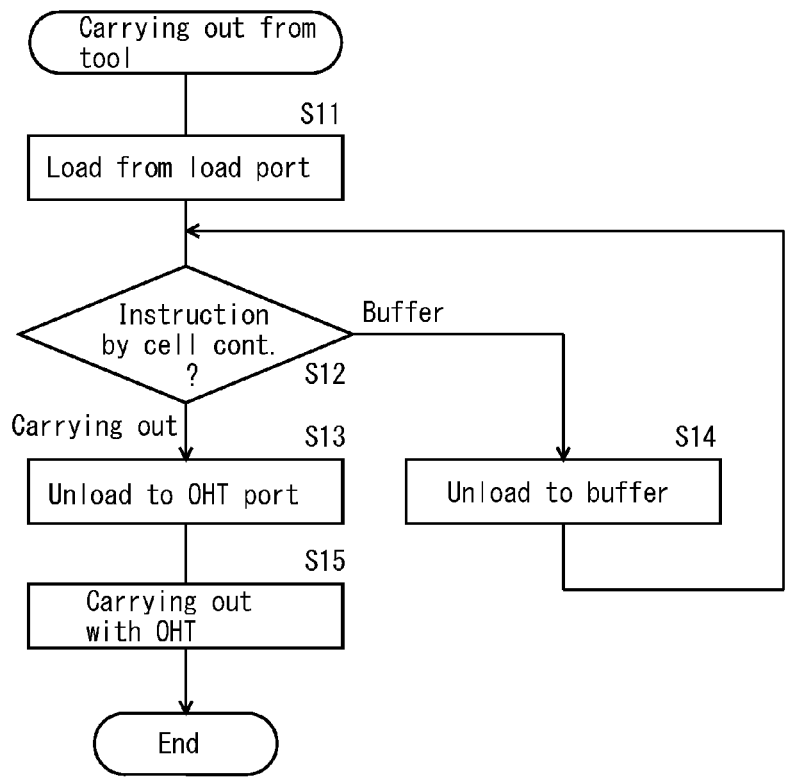
FIG. 6 is a flowchart showing an algorithm for transport from the tool according to a preferred embodiment of the present invention.

FIG. 6 shows an algorithm for carrying out goods from processing devices. In step S11, the shuttle carriage carries out an article from a load port, and then in accordance with an instruction received from the cell controller via a processing device (the case shown in FIG. 3) or from the MCS (the case shown in FIG. 4) or the like, a shuttle carriage selects an article unloading destination from between an OHT port and a buffer (steps S12 to S14). An article that has been placed at an OHT port is then carried out by the overhead traveling vehicle (step S15).

This preferred embodiment preferably includes features such as the following.

The traveling routes 10 and 14, the OHT ports 30, and the buffers 32 are preferably arranged using the ceiling space above the rear portion of the processing device 2 so that these elements do not obstruct the space above the passageway 38. If the traveling routes 9 and 10 are used in combination, and furthermore the traveling routes 12 and 14 are used in combination, the transport performance for the transport of goods to and from the processing device 2 is approximately doubled, and a large number of goods can be stored in the two rows of buffers 32.

If the upstream side of the OHT ports 30 and 31 is assigned to the unloading of goods from the overhead traveling vehicle 22, and the downstream side is assigned to the carrying out of goods by the overhead traveling vehicle 22, there is an increase in the number of opportunities in which an overhead traveling vehicle 22 executes unloading and carrying out in succession.

The shuttle carriage 24 and the overhead traveling vehicle 22 have the same structure, and the traveling routes 12 and 14 are connected to the traveling routes 8 to 10, thus making it possible to easily arrange the shuttle carriage 24 on the traveling routes 12 and 14 and move them to an area where they can undergo maintenance. Also, there is no need for dedicated parts, maintenance equipment, and the like for the shuttle carriage 24. Furthermore, it is possible to operate the shuttle carriage 24 as the overhead traveling vehicle 22, and operate the overhead traveling vehicle 22 as the shuttle carriage 24, thus making it possible to arrange them according to the transport load, the operating state of the processing device 2, and the like.

A shuttle carriage 24 that requires maintenance is capable of being withdrawn to a withdrawal portion 18.

There is no congestion or the like since the shuttle carriage 24 travels back and forth within the OSS area 36 and is not influenced by a shuttle carriage 24 in another area.

Note that either the traveling route 9 or 10 may be omitted. Also, the overhead traveling vehicle 22 and the shuttle carriage 24 may be a type of carriage that does not include an elevation platform. The OHT ports 30 and 31 and the buffers 32 are not limited to being side buffers between routes, and be under buffers directly below one route. In this case, goods 40 are delivered and received by lateral movement from another route. If side buffers and under buffers are used in combination, it is possible to increase the scale of the OHT ports 30 and the buffers 32. For example, it is possible to add under buffers dedicated to the overhead traveling vehicle 22 directly below the traveling route 10, and it is possible to provide three rows of buffers 32 by adding under buffers directly below the traveling route 14.

The traveling routes 12 and 14 are connected to the traveling routes 8 to 10, and the overhead traveling vehicle 22 and the shuttle carriage 24 have the same structure. For this reason, portions of the traveling routes 12 and 14 where little traveling is required preferably are assigned as portions for the withdrawal of unnecessary overhead traveling vehicles 22 and portions for the charging of overhead traveling vehicles 22.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A storage system in a ceiling space for using overhead traveling vehicles to transport goods to processing devices that have a load port, the system comprising:
   a traveling route for the overhead traveling vehicles;
   a shuttle carriage configured to transport goods to and from the processing devices;
   a traveling route for the shuttle carriage that includes a first portion of the traveling route for the shuttle carriage and a second portion of the traveling route for the shuttle carriage that are connected via a connection portion such that the traveling route for the shuttle carriage is a U-shaped or substantially U-shaped traveling route;

a first OHT port configured to enable the overhead traveling vehicles and the shuttle carriage to transport goods to and from the first OHT port; and buffers that are provided in a ceiling space directly above the processing devices in an up-down direction such that the buffers overlap the processing devices in the up-down direction, the buffers being configured to enable placement of goods by the shuttle carriage; wherein the second portion of the traveling route for the shuttle carriage is configured to enable delivery and reception of goods by the shuttle carriage between the load port of the processing devices, the buffers, and the first OHT port;

the first portion of the traveling route for the shuttle carriage, the second portion of the traveling route for the shuttle carriage, and the traveling route for the overhead traveling vehicles are arranged parallel or substantially parallel to each other and a row of the processing devices;

the buffers are arranged between the first portion of the traveling route for the shuttle carriage and the second portion of the traveling route for the shuttle carriage;

the first OHT port is arranged in a ceiling space between the traveling route for the overhead traveling vehicles and the second portion of the traveling route for the shuttle carriage; and the second portion of the traveling route for the shuttle carriage is arranged between the first OHT port and the buffers.

2. The storage system in a ceiling space according to claim 1, further comprising a second OHT port; wherein the traveling route for the overhead traveling vehicles is configured to pass through the ceiling space directly above the processing devices;

the second OHT port is provided in the ceiling space directly above the processing devices; and the traveling route for the shuttle carriage extends from a region directly above the load port to the ceiling space directly above the processing devices via the connection portion.

3. The storage system in a ceiling space according to claim 1, further comprising a second OHT port; wherein the load port is provided on a passageway side of a front surface of the processing devices;

the first OHT port is on the passageway side relative to the load port and the second OHT port is on the processing device side that is provided in the ceiling space directly above the processing devices;

the traveling route for the overhead traveling vehicles includes a traveling route directly above the passageway configured to transport goods to and from the first OHT port on the passageway side and a traveling route directly above the processing devices configured to transport goods to and from the second OHT port on the processing device side;

the traveling route for the shuttle carriage includes the second portion of the traveling route for the shuttle carriage configured to transport goods to and from the load port and the first OHT port on the passageway side; and the first portion of the traveling route for the shuttle carriage is configured to transport goods to and from the buffers and the second OHT port on the processing device side, and the connection portion.

4. The storage system in a ceiling space according to claim 1, wherein the shuttle carriage and the overhead traveling vehicles have a same structure, and a connection portion configured to connect the traveling route for the overhead traveling vehicles and the traveling route for the shuttle carriage is provided.

5. The storage system in a ceiling space according to claim 1, wherein the overhead traveling vehicles travel along the traveling route for the overhead traveling vehicles in one direction; and the shuttle carriage travels back and forth along the first portion of the traveling route for the shuttle carriage and the second portion of the traveling route for the shuttle carriage via the connection portion.

6. The storage system in a ceiling space according to claim 1, further comprising a second OHT port; wherein the first OHT port is included in a first set of OHT ports;

the second OHT port is included in a second set of OHT ports; and the second set of OHT ports is arranged in a ceiling space that is directly above a rear portion of one of the processing devices and between a first portion of the traveling route for the overhead traveling vehicles and the first portion of the traveling route for the shuttle carriage.

7. The storage system in a ceiling space according to claim 6, wherein the buffers include at least two rows of buffers.

8. The storage system in a ceiling space according to claim 1, wherein the buffers include at least two rows of buffers.

9. A storage method for goods in a ceiling space, in which a storage system in a ceiling space includes a traveling route for overhead traveling vehicles, a shuttle carriage configured to transport goods to and from the processing devices, a traveling route for the shuttle carriage that includes a first portion of the traveling route for the shuttle carriage and a second portion of the traveling route for the shuttle carriage that are connected via a connection portion such that the traveling route for the shuttle carriage is a U-shaped or substantially U-shaped traveling route, a first OHT port configured to enable the overhead traveling vehicles and the shuttle carriage to transport goods to and from the first OHT port, buffers that are provided in a ceiling space directly above the processing devices in an up-down direction such that the buffers overlap the processing devices in the up-down direction, the buffers being configured to enable placement of goods by the shuttle carriage, wherein the second portion of the traveling route for the shuttle carriage is configured to enable delivery and reception of goods by the shuttle carriage between the load port of the processing devices, the buffers, and the first OHT port, the first portion of the traveling route for the shuttle carriage, the second portion of the traveling route for the shuttle carriage, and the traveling route for the overhead traveling vehicles are arranged parallel or substantially parallel to each other and a row of the processing devices, the buffers are arranged between the first portion of the traveling route for the shuttle carriage and the second portion of the traveling route for the shuttle carriage, the first OHT port is arranged in a ceiling space between the traveling route for the overhead traveling vehicles and the second portion of the traveling route for the shuttle carriage, and the second portion of the traveling route for the shuttle carriage is arranged between the first OHT port and the buffers, the method comprising the steps of:

transporting goods to and from the first OHT port using the overhead traveling vehicles;

transporting goods between the first OHT port, the buffers, and the load port using the shuttle carriage; and
storing goods in the buffers using the shuttle carriage.

\* \* \* \* \*